(12) United States Patent
Minegishi et al.

(10) Patent No.: US 8,796,798 B2
(45) Date of Patent: Aug. 5, 2014

(54) IMAGING MODULE, FABRICATING METHOD THEREFOR, AND IMAGING DEVICE

(75) Inventors: Daiki Minegishi, Kanagawa (JP); Yasuhiro Satoh, Kanagawa (JP); Eiji Mochizuki, Tokyo (JP); Masayuki Fujishima, Kanagawa (JP); Hiroshi Miura, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 367 days.

(21) Appl. No.: 13/007,846

(22) Filed: Jan. 17, 2011

(65) Prior Publication Data

US 2011/0180893 A1 Jul. 28, 2011

(30) Foreign Application Priority Data

Jan. 27, 2010 (JP) ................................. 2010-015280

(51) Int. Cl.
*H01L 31/0232* (2014.01)
*H01L 27/146* (2006.01)

(52) U.S. Cl.
CPC .............................. *H01L 27/14618* (2013.01)
USPC ......................................... 257/432; 257/433

(58) Field of Classification Search
CPC ................................................ H01L 27/14618
USPC .............................. 257/432, 433, 98; 348/340
See application file for complete search history.

(56) References Cited

U.S. PATENT DOCUMENTS

| 7,535,509 | B2 * | 5/2009 | Takayama | ...................... 348/340 |
| 2006/0023108 | A1 * | 2/2006 | Watanabe et al. | ............. 348/335 |

FOREIGN PATENT DOCUMENTS

JP 2006-295481 10/2006

OTHER PUBLICATIONS

Kawakami, Shojiro et al. (2007), "Polalization imaging device utilizing photonic crystal polarizer", Proceedings of the $32^{nd}$ Optical Symposium (Japan), Optical Society of Japan, vol. 32 (with partial English translation thereof).

* cited by examiner

*Primary Examiner* — Phat X Cao
(74) *Attorney, Agent, or Firm* — Cooper & Dunham LLP

(57) ABSTRACT

An imaging module includes an imaging chip including a micro-lens guiding incident light and an imaging element in a semiconductor substrate and converting the incident light into an electric signal, and a polarizing glass chip including a polarizing filter glass having a polarizer determining a polarization direction of the incident light arranged on a transparent substrate such that the polarizer faces the micro-lens and a spacer member connected to the polarizing filter glass to adjust a gap between the polarizer and the micro-lens of the imaging chip. In the imaging module, a melt-bonding surface of the spacer member is melt-bonded to the semiconductor substrate such that the polarizer of the polarizing glass chip and the micro-lens of the imaging chip are arranged close to each other via the gap, and the imaging element and the micro-lens of the imaging chip are sealed by the polarizing glass chip.

11 Claims, 13 Drawing Sheets

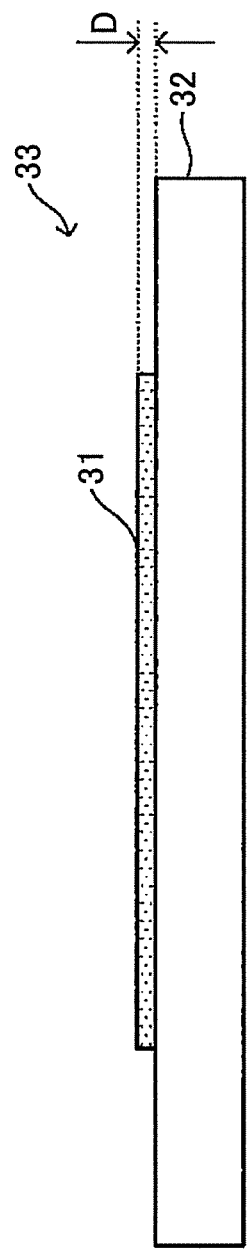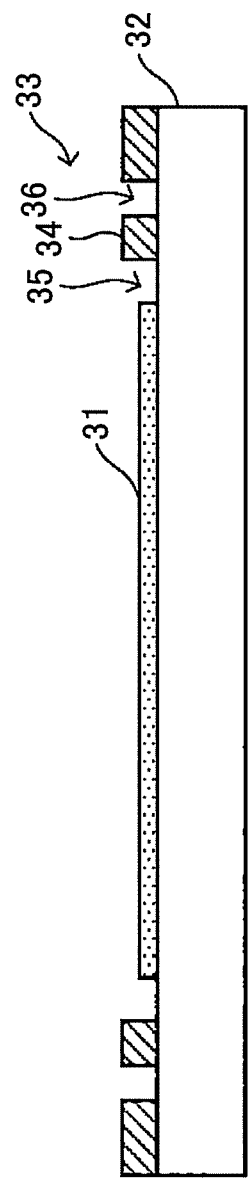

FIG.3
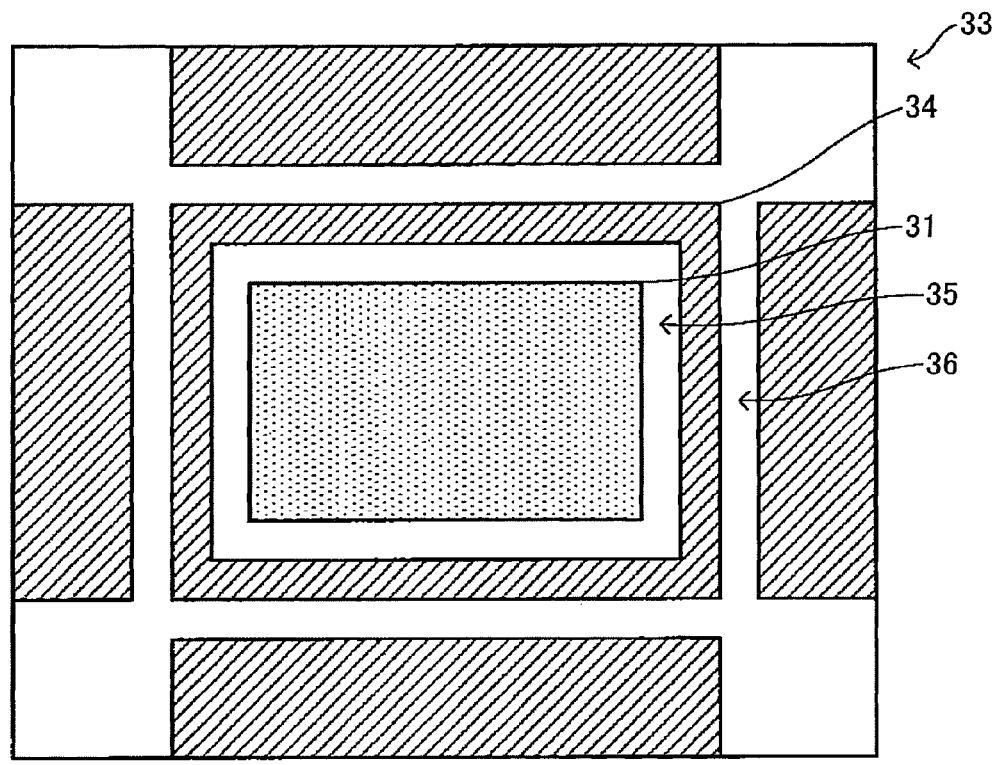
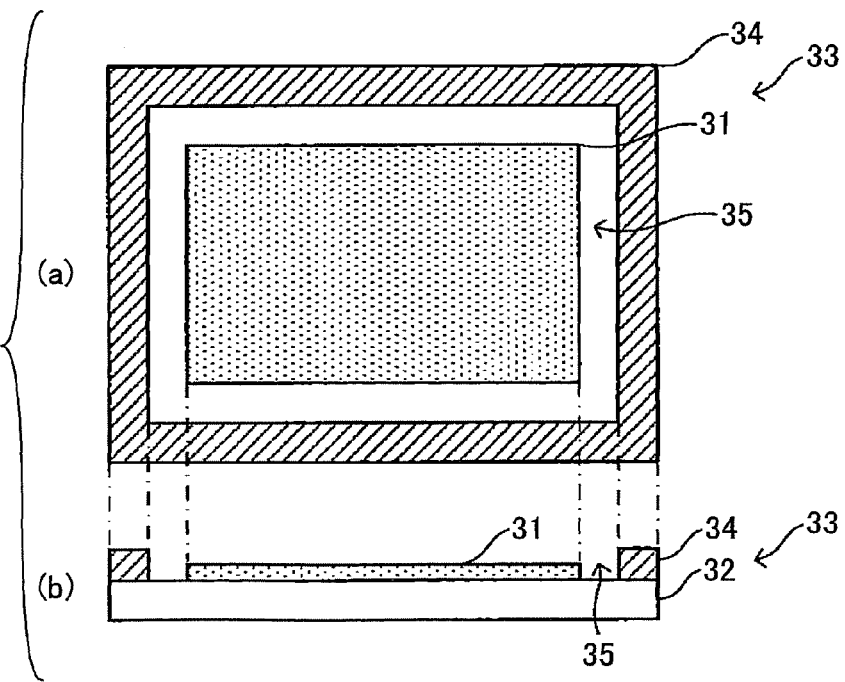
FIG.4 (a) (b)

--PRIOR ART--

--PRIOR ART--

IMAGING MODULE, FABRICATING METHOD THEREFOR, AND IMAGING DEVICE

BACKGROUND OF THE INVENTION

1. Field of the Invention

The invention generally relates to an imaging module capable of preventing foreign matter from attaching to a light-receiving surface thereof without degrading light receiving properties, a fabricating method for such an imaging module, and an imaging device having the imaging module.

2. Description of the Related Art

There are increasing demands on high density implementation of semiconductor components while growing demands on reduction in size and weight on electronic devices. Specifically, there are increasing demands on high integration of semiconductor imaging devices owing to advances in microfabrication technologies. In addition, various fabrication methods have been proposed for fabricating light-weight semiconductor imaging devices at low cost.

For example, a related art semiconductor imaging device includes a semiconductor imaging element having a light-receiving portion and a micro-lens configured to guide incident light to the light-receiving portion provided at an upper part of the light-receiving portion. The light-receiving portion and the micro-lens are covered with a low refractive index transparent material having a refractive index lower than that of the micro-lens. Further, an upper surface and side surfaces of the low refractive index transparent material are covered with a transparent material having hardness higher than that of the low refractive index transparent material. Accordingly, the semiconductor imaging element is packaged with double layers of the low refractive index transparent material and the transparent material having high hardness so as to prevent foreign matter from attaching on its light-receiving surface. That is, the semiconductor imaging element is covered with a transparent flat plate and side plates made of glass or resin to seal the entire semiconductor imaging element. As a result, foreign matter is prevented from entering into the semiconductor imaging element.

Similar proposals have been put forward with respect to preventing foreign matter from entering into the semiconductor imaging device. For example, Japanese Patent Application Publication No. 2006-295481 (hereinafter referred to as "Patent Document 1") discloses such a technology to prevent foreign matter from entering into a semiconductor imaging device. Below, the related art semiconductor imaging device disclosed in Patent Document 1 is reviewed with reference to FIG. 13.

FIG. 13 is a cross-sectional diagram illustrating a configuration of the related art semiconductor imaging device 200. As illustrated in FIG. 13, in the related art semiconductor imaging device 200, a surface of a semiconductor substrate 201 includes an imaging region 202, a peripheral circuit region 203, and an electrode region 204. The imaging region 202 is provided with plural micro-lenses 205 and a semiconductor imaging element 206. The peripheral circuit region 203 is provided with a not-shown peripheral circuit. Further, the electrode region 204 is provided with a later-described electrode pad 207. A transparent member 208 is provided above the micro-lenses 205 with a predetermined gap. The transparent member 208 includes a planar shape that is larger than the imaging region 202, and is connected to outer frame portions 210 provided as spacers to form a hollow portion 209. As a result, the transparent member 208 is configured not to be brought into contact with the micro-lenses 205. A ultraviolet curable (UV-curable) adhesive 211 is applied on bonding surfaces of the outer frame portions 210 to be bonded to the peripheral circuit region 203 of the semiconductor substrate 201. In the related art semiconductor imaging device 200 having such a configuration, the transparent member 208 covers the micro-lenses 205 and the semiconductor imaging element 206 provided in the imaging region 202. The outer frame portions 210 connected to the transparent member 208 is bonded to the semiconductor substrate 201 with the UV-curable adhesive 211 so as to seal the imaging region 202. As a result, foreign matter is prevented from attaching to a light-receiving surface of the semiconductor element 206.

Further, like a pixel in an electronic imaging element including a CCD or CMOS, a polarizer may be arranged in front of the light-receiving surface of the imaging element to polarize light in a different polarizing direction in different regions. In this case, if the polarizer is arranged away from the light-receiving surface of the imaging element, adjacent pixels arranged near a boundary of different polarization directions of the polarizers may receive plural different polarization beams. This phenomenon is generally called "polarization crosstalk". To avoid the polarization crosstalk, the polarizer may be arranged as close to the light-receiving surface of the imaging element as possible and the polarizer may be arranged such that a distance between the light-receiving surface of the imaging element and the polarizer may be kept constant without variability.

However, with the configuration of the related art semiconductor imaging device disclosed in Patent Document 1, it may be difficult to arrange the polarizer so close to the light-receiving surface of the imaging element, and to maintain the constant distance between the light-receiving surface of the imaging element and the polarizer without variability. The reason is as follows. As illustrated in FIG. 13, in the configuration of the related art semiconductor imaging device disclosed in Patent Document 1, the outer frame 210 is adhered to the semiconductor substrate 201 by applying the UV-curable adhesive 211 between the end of the bonding surface side of the outer frame 210 and the imaging region 202 and also between the end of the bonding surface side of the outer frame 210 and the electrode region 204. However, this adhesion of the outer frame 210 to the semiconductor substrate 201 may be difficult to be carried out by the above adhesion method of applying the UV-curable adhesive 211 between the end of the bonding surface side of the outer frame 210 and the imaging region 202 and also between the end of the bonding surface side of the outer frame 210 and the electrode region 204. In practice, the UV-curable adhesive 211 is applied to the end of a bonding surface side of the outer frame 210 at an opposite side where the transparent member 208 and the outer frame 210 are bonded. Thus, in the example of Patent Document 1, a total thickness of the UV-curable adhesive 211 may be 5 µm or more, that is, the distance between the light-receiving surface of the imaging element and the polarizer may have an additional distance of 5 µm or more. Thus, it may be difficult to arrange the polarizer as close as desired to the light-receiving surface of the imaging element. Further, the polarizer may be arranged with the constant distance based on the light-receiving surface of the imaging element as an origin between the light-receiving surface of the imaging element and the polarizer if the polarizer is arranged close to the light-receiving surface of the imaging element. However, the distance between the light-receiving surface of the imaging element and the polarizer may vary and thus not be constant due to inability to arrange the polarizer based on the light-receiving surface of the imaging element as the origin if the polarizer is arranged away from the light-receiving surface of the imaging element.

Another related art semiconductor image device is disclosed by Kawakami et al. in Proceedings of the 32nd Optical Symposium (Japan) (S. Kawakami et al., "Polalization imaging device utilizing photonic crystal polarizer", Proceedings of the 32nd Optical Symposium (Japan), Optical Society of Japan, Vol. 32, July 2007; hereinafter referred to as "Non-Patent Document 1"). The related art semiconductor image device disclosed by Kawakami et al. is reviewed with reference to FIG. 14. As illustrated in FIG. 14, in the related art semiconductor image device 300, a CCD 302 is arranged on a semiconductor substrate 301 and a polarizer 303 is arranged on the CCD 302 such that a polarization surface of the polarizer 303 faces plural micro-lenses 304. Further, in the related art semiconductor image device 300, an adhesive 305 is supplied between the polarizer 303 and the micro-lenses 304 to securely bond the polarizer 303 and the micro-lenses 304. With this configuration, the polarizer 303 is arranged close to a light-receiving surface of the CCD 302. However, with this configuration disclosed in Non-Patent Document 1, the adhesive 305 is supplied between the micro-lenses 304 arranged above the light-receiving surface of the CCD 302 and the polarizer 303. This may interfere with incident light received on the light-receiving surface of the CCD 302. Thus, the adhesive 305 may cause optical distortion of incident light to drastically lower optical properties of the micro-lenses 304.

SUMMARY OF THE INVENTION

It is a general object of at least one embodiment of the present invention to provide an imaging module capable of preventing foreign matter from attaching to a light-receiving surface thereof without degrading light receiving properties, a fabricating method for such an imaging module, and an imaging device having the imaging module that substantially eliminate one or more problems caused by the limitations and disadvantages of the related art.

In one embodiment, there is provided an imaging module that includes an imaging chip including a micro-lens configured to guide incident light and an imaging element provided in a semiconductor substrate and configured to convert the incident light guided by the micro-lens into an electric signal; and a polarizing glass chip including a polarizing filter glass having a polarizer configured to determine a polarization direction of the incident light and a transparent substrate, the polarizer being arranged on a surface of the transparent substrate such that the polarizer faces the micro-lens of the imaging chip, and a spacer member connected to the polarizing filter glass having the polarizer and configured to adjust a gap between the polarizer and the micro-lens of the imaging chip. In the imaging module, a melt-bonding surface of the spacer member is melt-bonded to a surface of the semiconductor substrate such that the polarizer of the polarizing glass chip and the micro-lens of the imaging chip are arranged close to each other via the gap, and such that the imaging element and the micro-lens of the imaging chip are sealed by the polarizing glass chip.

In another embodiment, there is provided a method for fabricating an imaging module including an imaging chip having a micro-lens configured to guide incident light and an imaging element provided on a semiconductor substrate and configured to convert the incident light guided by the micro-lens into an electric signal. The method includes fabricating a polarizing glass chip including a polarizing filter glass having a polarizer configured to determine a polarization direction of the incident light and a transparent substrate, the polarizer being arranged on a surface of the transparent substrate such that the polarizer faces the micro-lens of the imaging chip, and a spacer member connected to the polarizing filter glass and configured to adjust a gap between the polarizer of the polarizing glass chip and the micro-lens of the imaging chip; arranging the imaging chip held by a first holding member and the polarizing glass chip held by a second holding member such that the imaging chip held by the first holding member faces the polarizing glass chip held by the second holding member such that an imaging device is located in a gap between the imaging chip held by the first holding member and the polarizing glass chip held by the second holding member; acquiring an image of the imaging element or a first electrode pad of the imaging chip imaged by the imaging device and an image of the polarizer or the spacer member of the polarizing glass chip; adjusting locations of the imaging chip and the polarizing glass chip based on the corresponding images; and melt-bonding a melt-bonding surface of the spacer member provided on the polarizing glass chip to a surface of the semiconductor substrate.

In another embodiment, there is provided an imaging device comprising the aforementioned imaging module.

BRIEF DESCRIPTION OF THE DRAWINGS

Other objects and further features of embodiments will be apparent from the following detailed description when read in conjunction with the accompanying drawings, in which:

FIGS. 2A and 2B are diagrams illustrating a fabrication process of a polarizing filter glass of the imaging module;

FIG. 3 is a plan diagram illustrating the polarizing filter glass of the imaging module;

FIG. 4 is a diagram illustrating a fabrication process of a polarizing glass chip of the imaging module;

DESCRIPTION OF THE PREFERRED EMBODIMENTS

In the following, embodiments of the present invention will be described with reference to the accompanying drawings.

Figure 1:
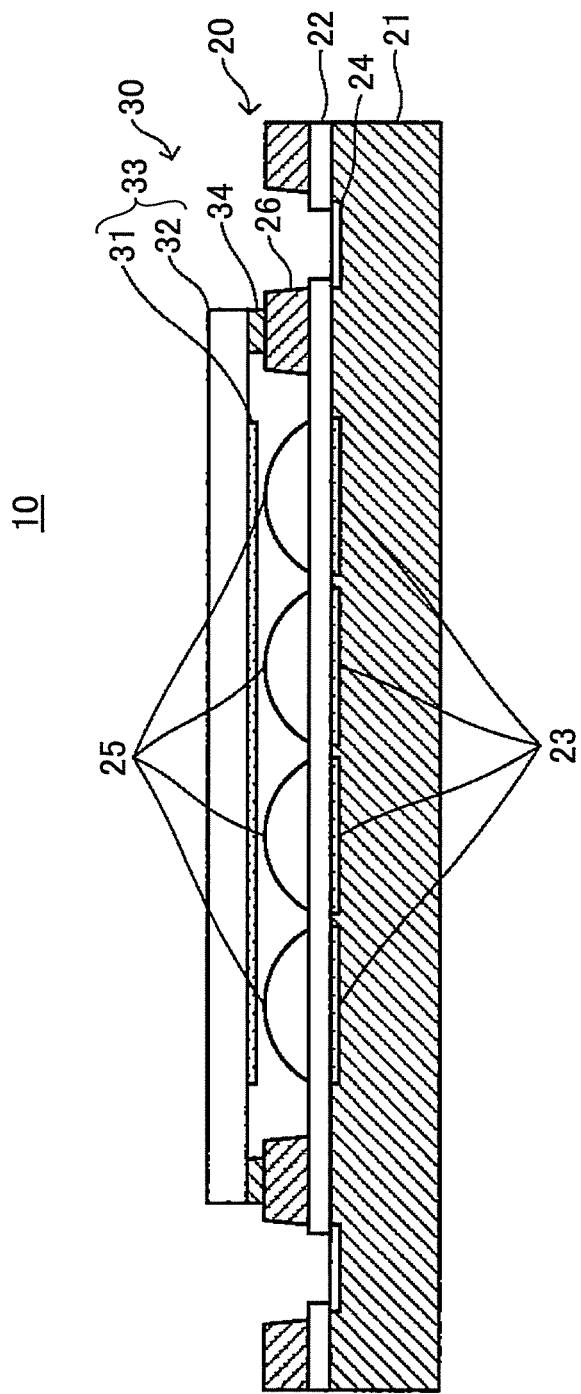
FIG. 1 is a cross-sectional diagram illustrating a configuration of an imaging module according to an embodiment.

FIG. 1 is a cross-sectional diagram illustrating a configuration of an imaging module according to an embodiment. As illustrated in FIG. 1, an imaging module 10 according to the embodiment includes an imaging chip 20 and a polarizing glass chip 30. The imaging chip 20 includes a semiconductor substrate 21, an inorganic insulator film 22 made of an oxide film such as a $SiO_2$ film, imaging elements 23, electrode pads 24, micro-lenses 25, and a structural film 26. The imaging elements 23 are configured to convert incident light into electric signals and are provided between the semiconductor substrate 21 and the inorganic insulator film 22. The electric pads 24 are nodes configured to supply the electric signals from the imaging elements 23 to an external circuit and are arranged near the outer periphery of a collection of light-receiving surfaces of the imaging elements 23. The micro-lenses 25 are formed by depositing an organic material on a surface of the inorganic insulator film 22 such that the micro-lenses 25 face the imaging elements 23. The micro-lenses 25 are configured to guide incident light to the imaging elements 23 via the inorganic insulator film 22. Further, the structural film 26 is a thermoplastic resin film formed by spin coating and is used for bonding a later-described spacer member 34 of the polarizing glass chip 30. The structural film 26 may be made of an organic material similar to a material of the micro-lenses 25 or an organic material differing from that of the micro-lenses 25, and have a film-thickness the same as a height of the micro-lenses 25. Note that in this embodiment, the micro-lenses 25 and the structural film 26 are formed on the inorganic insulator film 26. However, the micro-lenses 25 may be formed on the imaging elements 23 and the structural film 26 may be directly formed on the semiconductor substrate 21.

Next, the polarizing glass chip 30 includes a polarizing filter glass 33 having a glass wafer 32 and a polarizer portion 31 configured to regulate a polarization direction of incident light. In the polarizing filter glass 33, the polarizer portion 31 is formed on a surface of the glass wafer 32 with a thickness D. Further, the spacer member 34 is provided on a peripheral end or in a peripheral region of the polarizing filter glass 33. The polarizing glass chip 30 includes the spacer member 34 configured to provide a gap between the micro-lenses 25 and the polarizing filter glass 33. The polarizing glass chip 30 is provided to cover the collection of the micro-lenses 25, which form a light-receiving region of the imaging chip 20. Further, the spacer member 34 is pressed against the structural film 26, and is then heated at 200° C. for three minutes while applying pressure of 3 kgf. With such a process, the spacer member 34 is melt-bonded to the structural film 26 so that the light-receiving region corresponding to the collection of the micro-lenses 25 is sealed with the polarizing glass chip 30.

In the imaging module 10 according to the embodiment having such a configuration, the polarizing glass chip 30 is configured to cover the entire light-receiving region where the collection of the micro-lenses 25 of the imaging chip 20 is provided. Accordingly, foreign matter is prevented from entering into the light-receiving region of the imaging chip 20. Further, the gap between the micro-lenses 25 and the polarizing filter glass 33 may be reduced by adjusting a height of the spacer member 34. Thus, a crosstalk phenomenon where plural different polarization beams are received may be prevented.

Note that the structural film 26 may be omitted from the imaging chip 20, and the spacer member 34 may directly be melt-bonded to the inorganic insulator film 22 without having the structural film 26 in the imaging chip 20. The thickness D of the polarizer portion 31 illustrated in FIG. 2 is configured to be smaller than an optical wavelength of incident light. As a result, optical properties obtained by the configuration of the thickness D of the polarizer portion 31 may be utilized. Further, the spacer member 34 is provided on a peripheral end or in a peripheral end region of the polarizing filter glass 33. Accordingly, the light-receiving region of the corresponding imaging elements 23 of the imaging chip 20 may be sealed.

As described above, the imaging module according to the embodiment is capable of preventing foreign matter from entering into the light-receiving region without degrading properties of received light.

Next, a fabrication method for the imaging module according to an embodiment is described with reference to FIGS. 2A and 2B. FIGS. 2A and 2B are diagrams illustrating a fabrication process of the polarizing filter glass 33 of the imaging module 10. As illustrated in FIGS. 2A and 2B, reference numerals identical to those in FIG. 1 indicate the same components of the imaging module 10. As illustrated in FIG. 2A, the polarizer portion 31 is formed on a surface of the glass wafer 32 having transparency. The polarizer portion 31 is formed with the thickness D so that light transmitted via a photonic crystal structure and a wire-grid structure is controlled by later-described known methods. One of the known methods includes sequentially depositing a metallic film, electronic resist, and a photoreceptive material such as electron-beam resist or UV-sensitive resin on a glass plate in this order. If the photoreceptive material is electron-beam resist, electron-beam lithography is used for exposing the electron-beam resist; and if the photoreceptive material is UV-sensitive resin, an electron-beam stepper is used for exposing the UV-sensitive resin. After the exposure of the photoreceptive material, the photoreceptive material is patterned by development processing to expose part of a surface of the metallic layer (film). The exposed metallic film is further subjected to dry etching to thereby obtain an optical element having the metallic film patterning. The obtained optical element corresponds to the polarizer portion 31. Note that a direction or a period of the polarization structure may be changed in part of the region of the polarizer portion 31.

Next, as illustrated in FIG. 2B, a not-shown negative photoresist ("SU-8" produced by Nippon Kayaku Co., Ltd.) is used as one of resist releasers permanently used in the MEMS (Micro Electro Mechanical Systems) field. Further, the negative photoresist is deposited with a predetermined film thickness (of 1 μm in this embodiment) by spin coating. Thereafter, as illustrated in FIG. 2B and a plan diagram of FIG. 2B illustrated in FIG. 3, an uneven portion having a projection portion and a recess portion is formed in the outer periphery along the polarizer portion 31 by photolithography. The recess portion corresponds to a first cut portion 35 and the projection portion corresponds to the spacer member 34 provided in the outer periphery of the polarization portion 31. A second cut portion 36 having a recess shape for a dicing line is then formed in the polarizing filter glass 33. The polarizing filter glass 33 is then diced into a chip along the second cut portion 36 as illustrated in FIG. 4. In this step, the polarizing glass chip 30 having the spacer member 34 on its surface may be fabricated.

Figure 5:
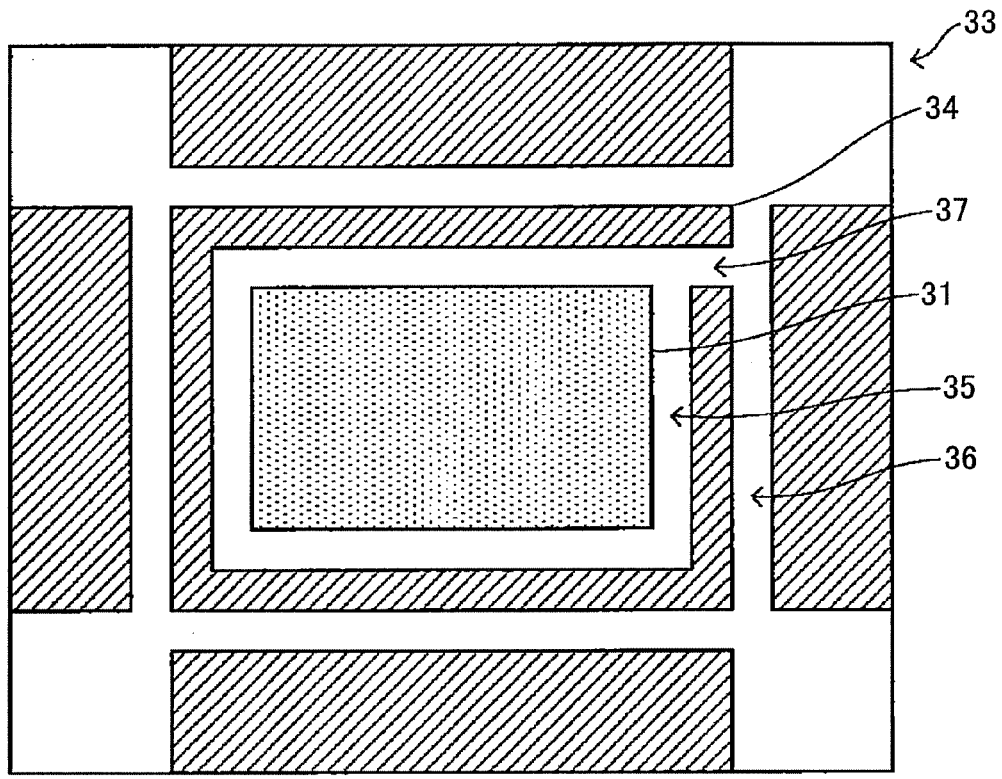
FIG. 5 is a plan diagram illustrating another configuration of the polarizing filter glass of the imaging module.
Figure 6:
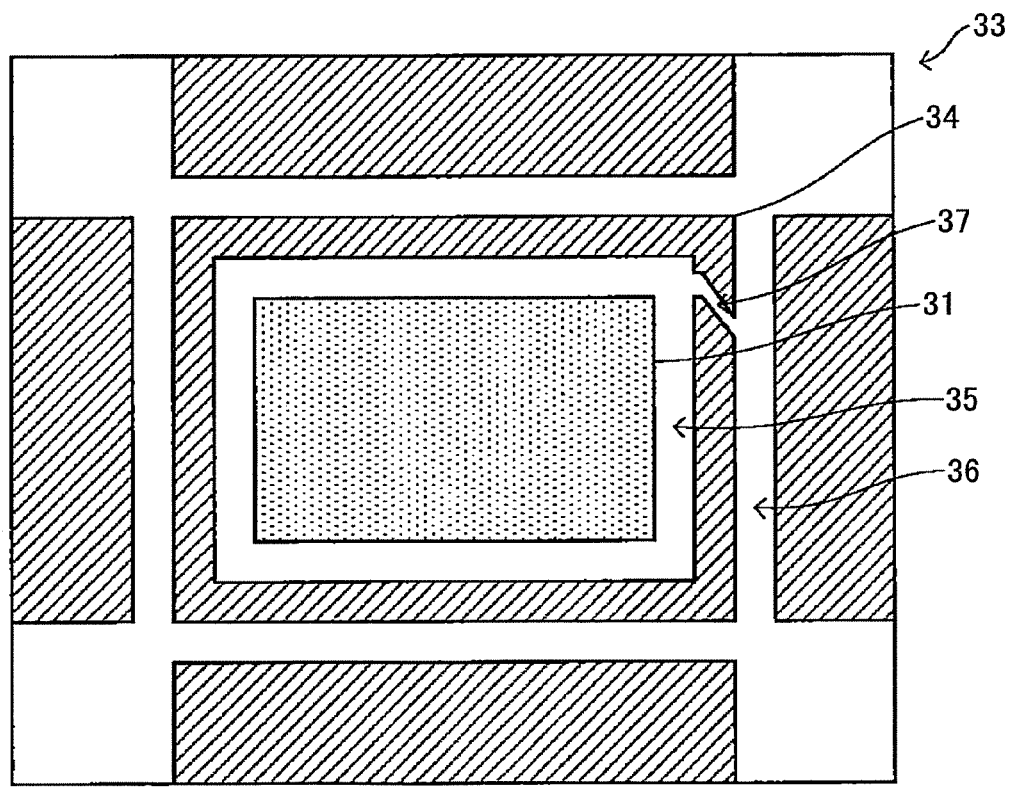
FIG. 6 is a plan diagram illustrating still another configuration of the polarizing filter glass of the imaging module.
Figure 7:
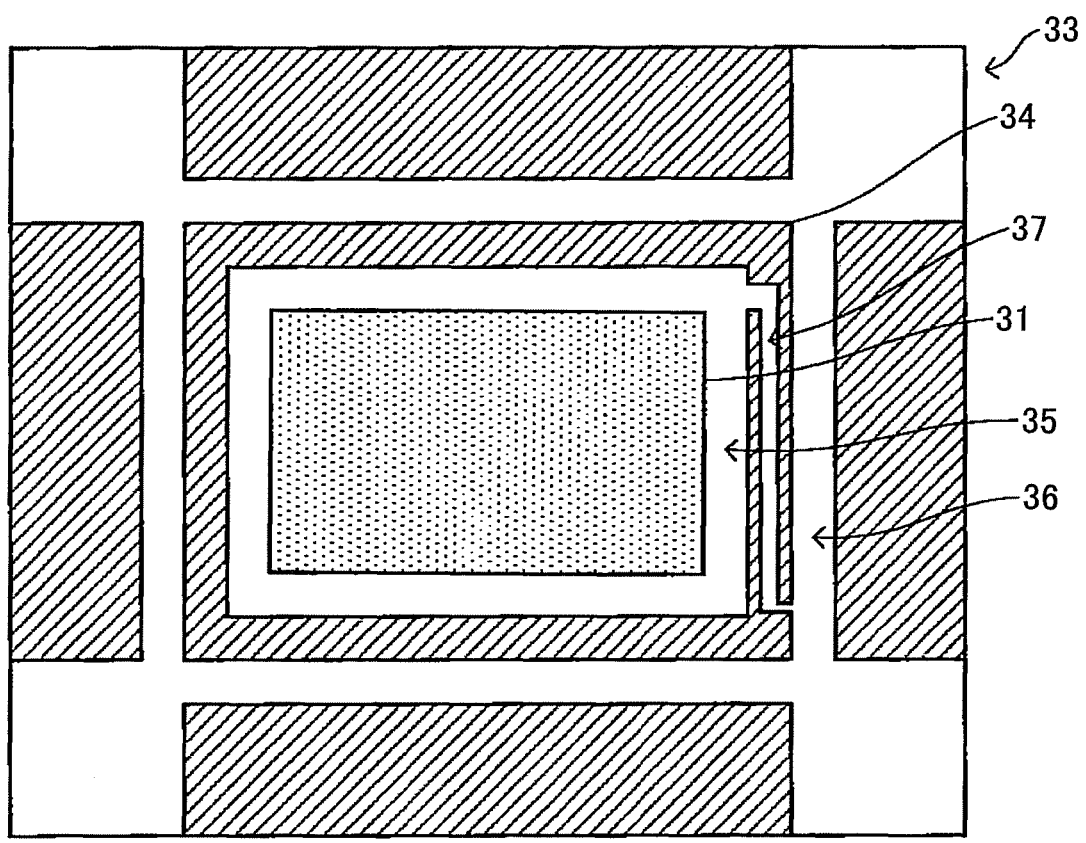
FIG. 7 is a plan diagram illustrating yet another configuration of the polarizing filter glass of the imaging module.

Note that as illustrated in (a) section of FIG. 4, the polarizing filter glass 33 has a frame structure which is obtained by forming the spacer member 34 along the outer periphery of the polarizer portion 31. However, with this frame structure, outgassing may be generated inside the frame structure of the film enclosing the polarizer portion 31. To overcome this, another structure of the polarizing filter glass is proposed. A third cut portion 37 is formed in a part of the spacer member 34 as illustrated in FIG. 5 such that the third cut portion 37 is connected to form a passage between the first cut portion 35 and the second cut portion 36. The third cut portion 37 formed in the part of the spacer member 34 may include a structure having a corner portion as illustrated in FIG. 6 or a structure having two corner portions as illustrated in FIG. 7 so as to communicate between the light-receiving region and outside of the light-receiving region. With this configuration of forming a cut portion in the part of the frame structure, outgassing products inside the frame structure may be discharged so that adverse effects due to the outgassing may be suppressed. Note that a cross-sectional area of an air course formed by the third cut portion 37 may be limited to a size that does not allow foreign matter to pass through the air course of the third cut portion 37 and enter into the light-receiving region.

Next, an outline of a fabrication process of the imaging module according to the embodiment using the polarizing glass chip 30 fabricated in the fabrication process illustrated in FIGS. 2A to 7 is described with reference to accompanying drawings.

Figure 8A:
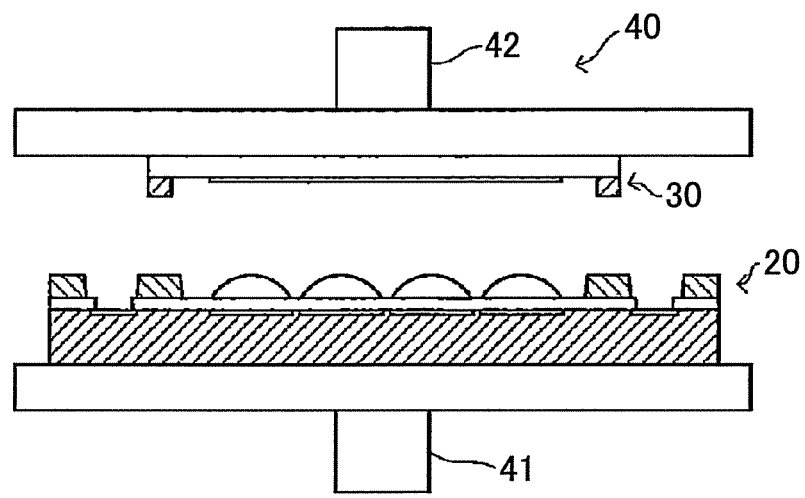
FIGS. 8A through 8D are cross-sectional diagrams illustrating a fabrication process of the imaging module according to the embodiment.
Figure 8B:
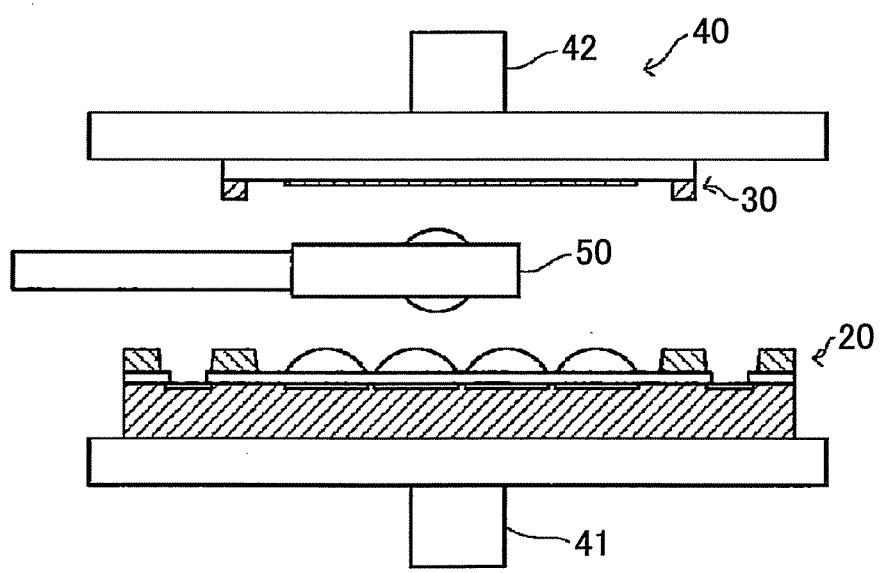

FIGS. 8A through 8D are cross-sectional diagrams illustrating a fabrication process of the imaging module according to the embodiment. In FIGS. 8A through 8D, reference numerals identical to those in FIGS. 1 to 7 indicate the same components of the imaging module 10. As illustrated in FIG. 8A, the imaging module is fabricated using a mounting device 40 having adsorption stages (i.e., first and second holding members) 41 and 42 with a not-shown heating mechanism. The adsorption stage 41 holds the imaging chip 20 and the adsorption stage 42 holds the polarizing glass chip 30 so that the imaging chip 20 and the polarizing glass chip 30 are secured on the respective adsorption stages 41 and 42. As illustrated in FIG. 8B, a camera unit 50 is located between the imaging chip 20 and the polarizing glass chip 30 secured on the respective adsorption stages 41 and 42. The camera unit 50 acquires images of the structural film 26 of the imaging chip 20 and the spacer member 34 of the polarizing glass chip 30 to compute a positional relationship based on the acquired images of the structural film 26 and the spacer member 34. The camera unit 50 then carries out locating processing of the structural film 26 and the spacer member 34 based on the computed positional relationship.

The locating processing is outlined. The camera unit 50 detects positions of the electrode pads 24 provided in the outer periphery of the structural film 26 and an element array (several μm per pixel) of the imaging element 23 based on the acquired image of the imaging chip 20. The camera unit 50 detects positions of the polarizer portion 31 and the spacer member 34 based on the acquired image of the polarizing glass chip 30. Note that the structural member 31 formed on the polarizing glass chip 30 and the spacer member 34 are designed based on a size of the light-receiving region of the imaging chip 20. Accordingly, positions and angle deviations of the imaging chip 20 and the polarizing glass chip 30 may be computed based on detected data of the two acquired images of the imaging chip 20 and the polarizing glass chip 30. For example, the imaging chip 20 and the polarizing glass chip 30 are located such that a line between two diagonal points of the imaging chip 20 match a line between two diagonal points of the polarizing glass chip 30.

Figure 8C:
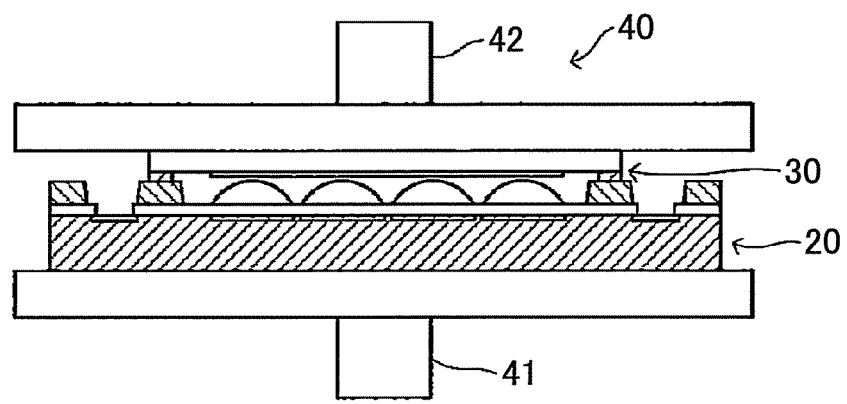
Figure 8D:
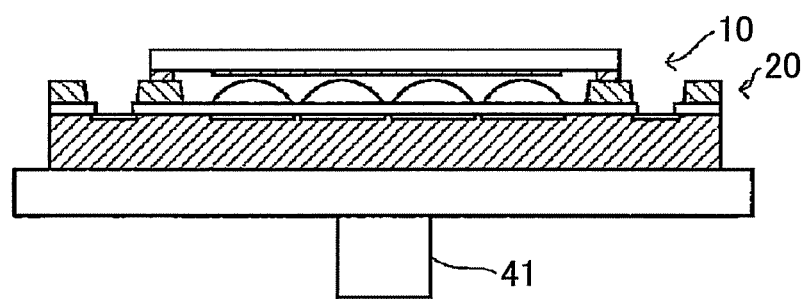

After the locating of the imaging chip 20 and the polarizing glass chip 30, the camera unit 50 is removed from a place between the imaging chip 20 and the polarizing glass chip 30. As illustrated in FIG. 8C, the structural film 26 of the imaging chip 20 is heated via the adsorption stage 42 at 200° C. that is equal to or higher than a glass transition temperature and the structural film 26 is then left to stand for three minutes. After three minutes have elapsed, the adsorption stages 41 and 42 are moved toward each other such that the imaging chip 20 and the polarizing glass chip 30 are in mutually overlapped contact, and pressure is applied to the imaging chip 20 and the polarizing glass chip 30, which is then left to stand for five minutes. The pressured imaging chip 20 and the polarizing glass chip 30 are then cooled, for example, to a temperature of equal to or lower than the glass transition temperature, thereby melt-bonding the imaging chip 20 and the polarizing glass chip 30. After the structural film 26 of the imaging chip 20 and the spacer member 34 of the polarizing glass chip 30 are melt-bonded, the adsorption stages 41 and 42 are moved away from each other, thereby completing a bonding step of the imaging chip 20 and the polarizing glass chip 30 as illustrated in FIG. 8D. The imaging module 10 is thus fabricated based on the above fabrication process. After the imaging module 10 is fabricated, a gap between the micro-lenses 23 of the imaging chip 20 and the polarizing glass chip 30 is measured by a displacement gauge. The results at the measurement points are within a range of 1 to 3 μm.

Figure 9A:
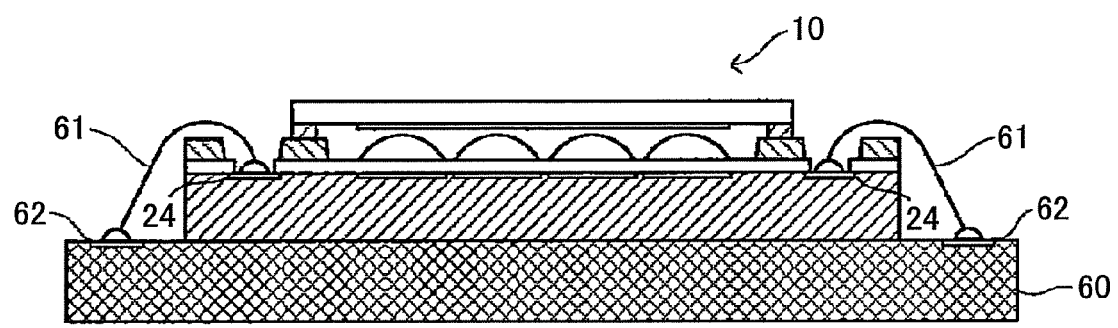
FIGS. 9A and 9B are cross-sectional diagrams illustrating connection steps of gold wires.
Figure 9B:
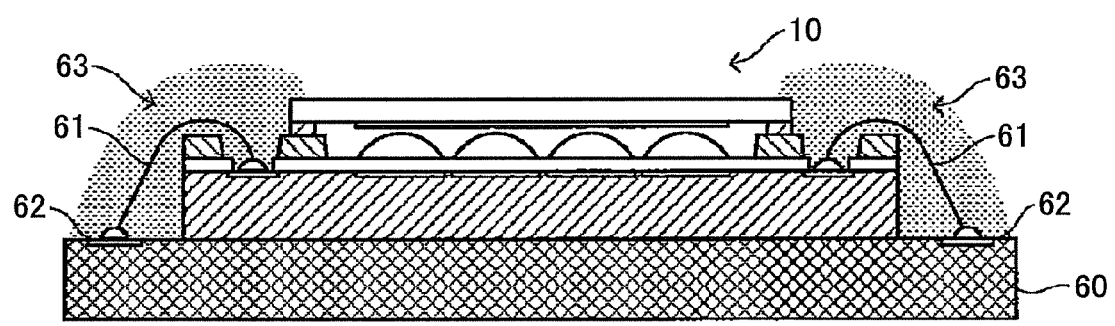

Next, the imaging chip 20 is attached to a Printed Circuit Board (PCB) substrate 60 with paste as illustrated in FIG. 9A. The electrode pad 24 of the imaging chip 20 and an electrode pad 62 of the PCB substrate 60 are then wire-bonded with a gold wire 61, and thermosetting resin 63 is applied to an entire outer periphery of the gold wire 61 as a potting material for sealing the gold wire 61. Note that the PCB substrate 60 may be either a rigid type PCB substrate or a flexible type PCB substrate. Note also that an anisotropically-conductive film and the like may be used in the above wire-bonding method.

Figure 10:
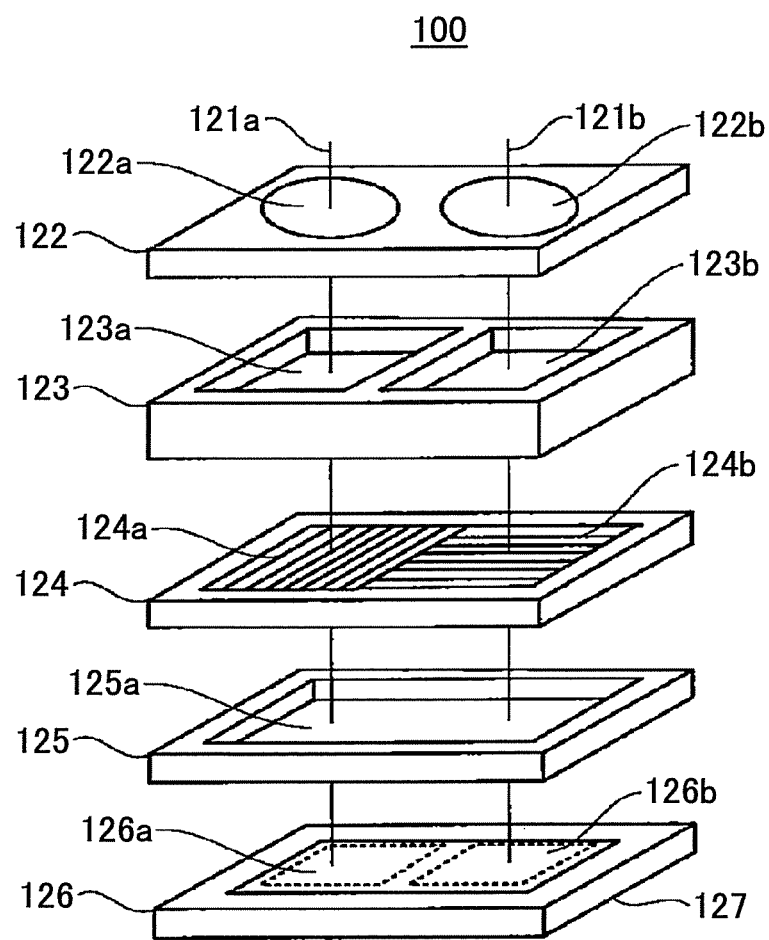
FIG. 10 is an exploded perspective diagram illustrating another configuration of an imaging device according to another embodiment.
Figure 11:
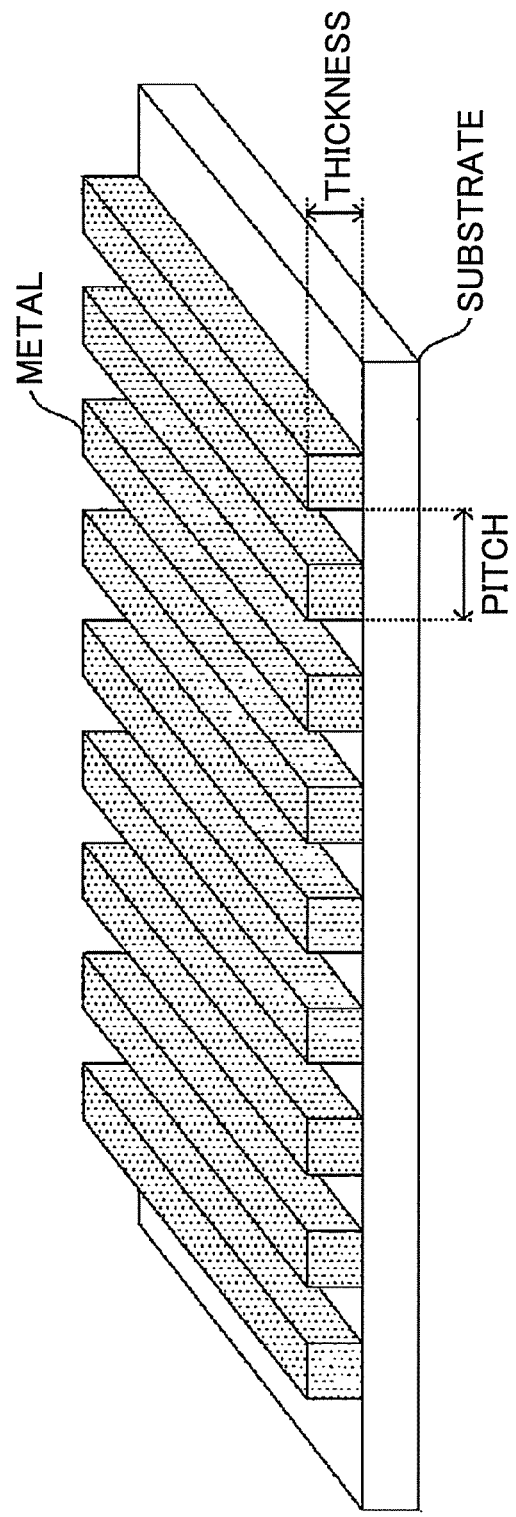
FIG. 11 is a perspective diagram illustrating a structure of a wire-grid polarizer.
Figure 12:
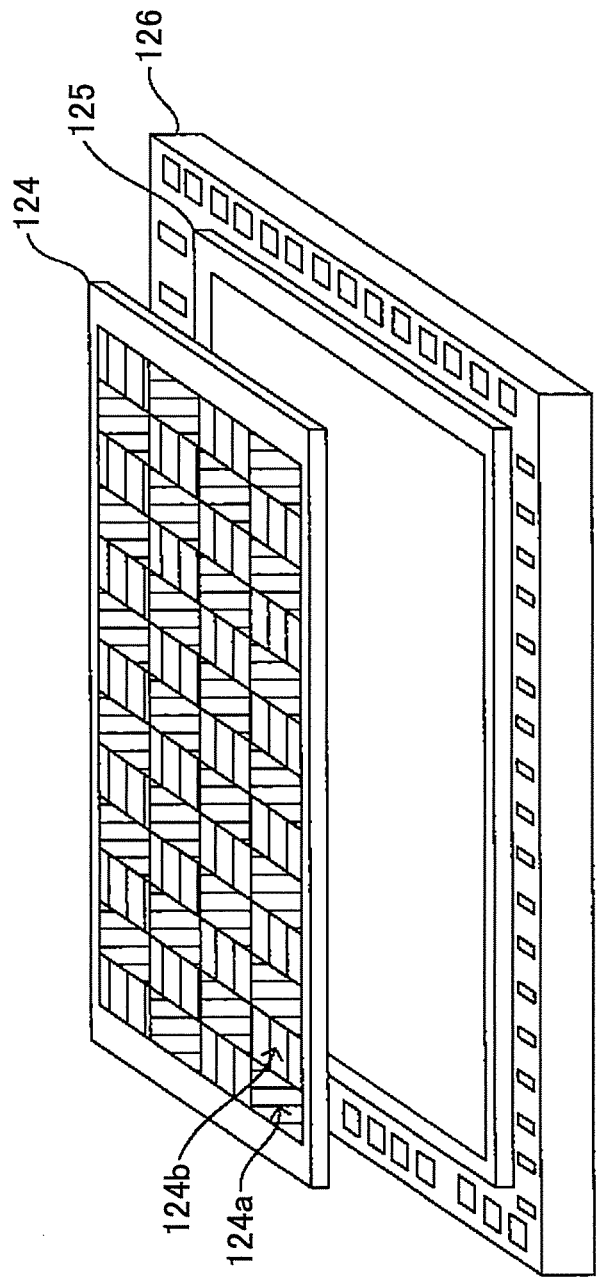
FIG. 12 is an exploded perspective diagram partially illustrating another configuration of the imaging device.
Figure 13:
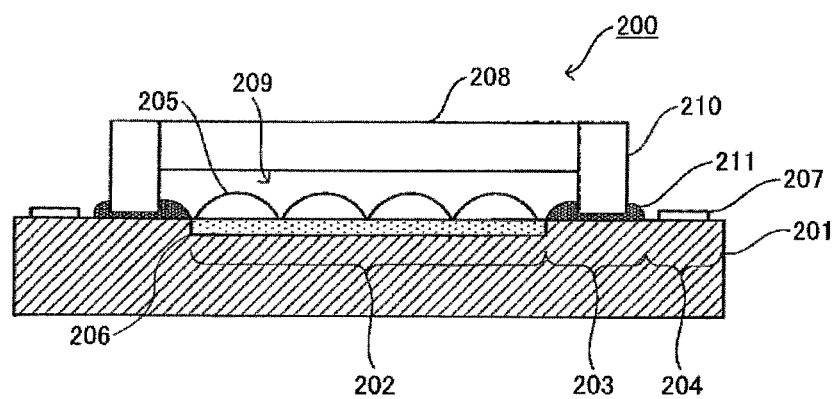
FIG. 13 is a cross-sectional diagram illustrating a configuration of a related art semiconductor imaging device.
Figure 14:
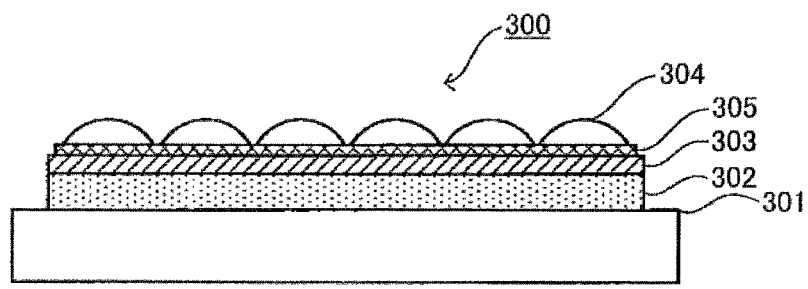
FIG. 14 is a cross-sectional diagram illustrating a configuration of another related art semiconductor imaging device.

FIG. 10 is an exploded perspective diagram illustrating a configuration of the imaging device according to the embodiment. In FIG. 10, a polarization camera 100 illustrated as an example of the imaging device includes two separate imaging elements, namely, a first imaging element for a P-polarization image and a second imaging element for an S-polarization image. The first and second imaging elements are adjacently arranged. Specifically, the polarization camera 100 includes a lens array 122, a shielding spacer 123, a polarizing filter 124, a spacer 125, and a solid imaging unit 126 stacked in a layered manner. The lens array 122 includes two imaging lenses, namely, a first imaging lens 122a and a second imaging lens 122b. The first and second imaging lenses 122a and 122b are separate lenses formed of an aspheric lens and have the same shapes. The first and second imaging lenses 122a and 122b are arranged in a same plane such that a first optical axis 121a of the first imaging lens 122a and a second optical axis 121b of the second imaging lens 122b are in parallel with each other. The shielding spacer 123 includes two opening portions, namely, a first opening portion 123a and a second opening portion 123b. The shielding spacer 123 having the first opening portion 123a and the second opening portion 123b is arranged at a side opposite to an imaging subject side of the lens array 122. The first and second opening portions 123a and 123b run through the shielding spacer 123 with predetermined sizes determined based on the first and second optical axes 121a and 122b. Inner wall surfaces of the first and second opening portions 123a and 123b are treated with antireflective treatment such as black finishing, roughening or matting. The polarizing filter 124 is a region segmentation polarizing filter that includes two polarizing regions, namely, a first polarizing region 124a and a second polarizing region 124b. The first polarizing region 124a and the second polarizing region 124b have polarization surfaces oriented at 90 degrees differing from each other. The polarizing filter 124 having the first polarizing region 124a and the second polarizing region 124b is arranged at a side opposite to the lens array 124 side of the shielding spacer 123. The first polarizing region 124a and the second polarizing region 124b are configured to extract oscillating components (i.e., polarization component) in directions along the polarization surfaces from unpolarized beams of an oscillating electromagnetic field in unspecified directions to selectively pass through the oscillating components in the corresponding directions along the polarization surfaces, thereby converting the oscillating components in the corresponding directions along the polarization surfaces into linear polarization beams. Note that the region segmentation polarizing filter having a clear boundary portion may be obtained by utilizing a wire-grid polarizer formed of fine metallic projections and depressions, or an auto-cloning photonic crystal polarizer. FIG. 11 illustrates a configuration of the wire-grid polarizer. As illustrated in FIG. 11, metallic components made of Al, Cr or the like are regularly formed with a thickness and a pitch of several hundred nm on a substrate made of glass or the like to obtain a polarizer having the wire-grid structure. The wire-grid structure formed in this manner has a unique optical property to absorb orthogonal polarization components. The spacer 125 has a rectangular shape and is configured to include an opening portion 125a for the first and second polarizing regions 124a and 124b of the polarizing filter 124. The spacer 125 is arranged at a side opposite to the shielding spacer 123 side of the polarizing filter 124. The solid imaging unit 126 includes two solid imaging elements, namely, a first solid imaging element 126a and a second solid imaging element 126b arranged on a substrate 127. The solid imaging unit 126 having the first solid imaging element 126a and the second solid imaging element 126b is arranged at a side opposite to the polarizing filter 124 side of the spacer 125. Note that since the imaging device according to the embodiment carries out monochrome sensing, the first solid imaging element 126a and the second solid imaging element 126b do not include color filters. However, the first solid imaging element 126a and the second solid imaging element 126b may optionally include the color filters when the imaging device according to the embodiment carries out color image sensing. Note also that the configuration of the imaging device according to the embodiment is not limited to the above described example. The imaging device according to the embodiment may be configured include one polarizing filter 124 where the first polarizing regions 124a and the second polarizing regions 124b having the polarization surfaces oriented at 90 degrees differing from each other are arranged like tiles as illustrated in FIG. 12. In the imaging device having the configuration illustrated in FIG. 12, there is an advantage that the number of lens groups (not shown) arranged on the polarizing filter 124 may be one.

The imaging devices according to the embodiment having the configurations illustrated in FIGS. 10 and 12 that are provided with the imaging module illustrated in FIG. 1 or fabricated based on the imaging module fabrication method illustrated in FIGS. 2 through 9 are capable of acquiring an excellent image without degrading optical properties of micro-lenses in the imaging chip.

As described above, the imaging module according to the embodiment includes the imaging chip having the imaging elements and the micro-lenses. The imaging elements 23 are provided in the semiconductor substrate to convert incident light into electronic signals. The micro-lenses are arranged corresponding to the imaging elements so as to guide incident light to the imaging elements. Further, the imaging module according to the embodiment includes a polarizing glass chip having the polarizing filter glass provided on the transparent substrate such that the polarizer configured to determine the polarization direction of the incident light faces the micro-lenses and the spacer member configured to adjust the gap between the polarizer and the micro-lenses. A melt-bonding surface of the spacer member is then melt-bonded to the semiconductor substrate such that the polarizer and the micro-lenses are arranged close to each other via the gap, and the polarizing glass chip covers the imaging elements and the micro-lenses to seal the imaging elements and the micro-lenses. Accordingly, foreign matter is prevented from entering into the light-receiving region of the imaging chip. With this configuration, the polarizer and the micro-lenses are arranged close to each other via the gap without using adhesives. Thus, since the polarizer is capable of being arranged near the light-receiving surface of the imaging element, the crosstalk may be minimized. As a result, the imaging module according to the embodiment may not degrade the light receiving properties.

Further, the thickness of the polarizer is less than the optical wavelength of incident light. Moreover, the polarizer is formed in at least part of the light-receiving region of the imaging element.

The area of the polarizing glass chip is larger that the area of the light-receiving region of the imaging element and smaller than the total area including the area of the light-receiving region of the imaging element and the area of the electrode pad configured to acquire the electric signals converted by the imaging element.

Further, the height of the spacer member is greater than the height of the micro-lens in the optical direction. The melt-bonding surface of the spacer member is melt-bonded to the structural film provided in the outer peripheries of the micro-lens setting region and the imaging element setting region. The total of the height of the spacer member and the thickness of the structural film is greater than the height of the micro-lens in the optical direction. Thus, the polarizer may not be in contact with the micro-lenses.

The micro-lens and the structural film may preferably be made of organic materials. Further, since the spacer member has the frame structure that encloses the outer periphery of the polarizer, the spacer member encloses the light-receiving region of the imaging elements. Accordingly, the foreign matter may be prevented from entering into the light-receiving region of the imaging elements. The spacer member includes the cut portion in the part of the frame structure of the spacer member, so that the adverse effect of the outgassing products generated inside the frame structure may be suppressed by discharging the outgassing products from the cut portion. Note that the cut portion formed in the frame structure of the spacer member preferably includes at least one corner portion for minimizing the amount of foreign matter entering from the cut portion.

The method for fabricating the imaging module according to the embodiment is capable of preventing foreign matter from entering without degrading the light-receiving properties. The imaging module according to the embodiment or the imaging device having the imaging module fabricated by the method for fabricating the imaging module according to the embodiment may acquire an excellent image without degrading the optical properties of the micro-lenses of the imaging chip. Accordingly, the imaging device having high reliability may be provided.

As described above, according to the embodiment, the imaging module, the fabrication method, and the imaging device capable of preventing foreign matter from entering into the light-receiving region may be provided without degrading the light-receiving properties.

Embodiments of the present invention have been described for the purpose of illustration. The present invention is not limited to these embodiments, but various variations and modifications may be made without departing from the scope of the present invention. The present invention should not be interpreted as being limited to the embodiments that are described in the specification and illustrated in the drawings.

The present application is based on Japanese Priority Application No. 2010-015280 filed on Jan. 27, 2010, with the Japanese Patent Office, the entire contents of which are hereby incorporated by reference.

What is claimed is:

1. An imaging module comprising:
    an imaging chip including a micro-lens configured to guide incident light and an imaging element provided in a semiconductor substrate and configured to convert the incident light guided by the micro-lens into an electric signal; and
    a polarizing glass chip including a polarizing filter glass having a polarizer configured to determine a polarization direction of the incident light and a transparent substrate, the polarizer being arranged on a surface of the transparent substrate such that the polarizer faces the micro-lens of the imaging chip, and a spacer member connected to the polarizing filter glass having the polarizer and configured to adjust a gap between the polarizer and the micro-lens of the imaging chip,
    wherein a melt-bonding surface of the spacer member is melt-bonded to a surface of the semiconductor substrate such that the polarizer of the polarizing glass chip and the micro-lens of the imaging chip are arranged close to each other via the gap, and such that the imaging element and the micro-lens of the imaging chip are sealed by the polarizing glass chip without degrading properties of received light,
    the spacer member includes a frame structure configured to enclose an outer periphery of the polarizer,
    the spacer member including the frame structure partially includes a cut portion, and
    the cut portion is configured to communicate spatially between a light-receiving region of the imaging chip and outside of the light-receiving region such that outgassing is achieved via the cut portion.

2. The imaging module as claimed in claim 1, wherein a thickness of the polarizer is less than an optical wavelength of the incident light.

3. The imaging module as claimed in claim 1, wherein the polarizer is formed in at least a part of a light-receiving region of the imaging element.

4. The imaging module as claimed in claim 1, further comprising:
    an electrode pad configured to acquire the electric signal converted by the imaging element,
    wherein an area of the polarizing glass chip is larger than an area of a light-receiving region of the imaging element and smaller than a total area including the area of the light-receiving region of the imaging element and a setting area of the electrode pad.

5. The imaging module as claimed in claim 1, wherein a height of the spacer member is greater than a height of the micro-lens in an optical direction.

6. The imaging module as claimed in claim 1, further comprising:
    a structural film provided in outer peripheries of setting regions of the imaging element and the micro-lens, wherein the melt-bonding surface of the spacer member is melt-bonded to the structural film provided in the outer peripheries of the setting regions of the imaging element and the micro-lens.

7. The imaging module as claimed in claim 6, wherein a total of a height of the spacer member and a thickness of the structural film is greater than a height of the micro-lens in an optical direction.

8. The imaging module as claimed in claim 1, further comprising:
    a structural film provided in outer peripheries of setting regions of the imaging element and the micro-lens,
    wherein the micro-lens and the structural film provided in the outer peripheries of the setting regions of the imaging element and the micro-lens are made of organic materials.

9. The imaging module as claimed in claim 1, wherein the cut portion provided in part of the spacer member having the frame structure includes at least one corner portion.

10. An imaging device comprising the imaging module as claimed in claim 1.

11. An imaging module comprising:
    an imaging chip including a micro-lens configured to guide incident light and an imaging element provided in a semiconductor substrate and configured to convert the incident light guided by the micro-lens into an electric signal;
    a polarizing glass chip including a polarizing filter glass having a polarizer configured to determine a polarization direction of the incident light and a transparent substrate, the polarizer being arranged on a surface of the transparent substrate such that the polarizer faces the micro-lens of the imaging chip, and a spacer member connected to the polarizing filter glass having the polarizer and configured to adjust a gap between the polarizer and the micro-lens of the imaging chip;
    a structural film provided in outer peripheries of setting regions of the imaging element and the micro-lens; and
    an inorganic insulator film,
    wherein a melt-bonding surface of the spacer member is melt-bonded to an upper surface of the structural film such that the polarizer of the polarizing glass chip and the micro-lens of the imaging chip are arranged close to each other via the gap, and such that the imaging element and the micro-lens of the imaging chip are sealed by the polarizing glass chip,
    wherein the micro-lens is formed directly on either the inorganic insulator film or the imaging element, and the structural film is formed directly on either the inorganic insulator film or the semiconductor substrate,
    wherein the spacer member includes a frame structure configured to enclose an outer periphery of the polarizer, and
    wherein the spacer member including the frame structure partially includes a cut portion, and the cut portion is configured to communicate spatially between a light-receiving region of the imaging chip and outside of the light-receiving region such that outgassing is achieved via the cut portion.

* * * * *